United States Patent [19]

Hartman et al.

[11] 4,227,975

[45] Oct. 14, 1980

[54] SELECTIVE PLASMA ETCHING OF DIELECTRIC MASKS IN THE PRESENCE OF NATIVE OXIDES OF GROUP III-V COMPOUND SEMICONDUCTORS

[75] Inventors: Robert L. Hartman, Warren Township, Somerset County; Louis A. Koszi, Scotch Plains; Cyril J. Mogab, Berkeley Heights; Bertram Schwartz, Westfield, all of N.J.

[73] Assignee: Bell Telephone Laboratories, Incorporated, Murray Hill, N.J.

[21] Appl. No.: 7,422

[22] Filed: Jan. 29, 1979

[51] Int. Cl.³ .............. H01L 21/283; H01L 21/308; H01L 21/326
[52] U.S. Cl. .................................. 204/15; 29/572; 29/578; 29/579; 156/643; 156/648; 156/655; 156/662; 204/23; 204/32 S; 204/38 A; 204/192 E
[58] Field of Search ............. 156/648, 649, 655, 662, 156/643, 657; 357/16, 17, 56; 29/578, 572, 579; 204/23, 38 A, 32 S, 192 E, 15; 252/79.1

[56] References Cited

U.S. PATENT DOCUMENTS

| 3,795,557 | 3/1974 | Jacob | 252/79.1 |
| 3,867,216 | 2/1975 | Jacob | 156/643 |
| 3,880,684 | 4/1975 | Abe | 252/79.1 |
| 3,975,252 | 8/1976 | Fraser et al. | 204/192 |
| 4,011,113 | 3/1977 | Thompson et al. | 156/648 |
| 4,030,967 | 6/1977 | Ingrey et al. | 156/643 |
| 4,110,661 | 8/1978 | Harris et al. | 357/17 |

OTHER PUBLICATIONS

Mogab et al., "Plasma . . . Undercutting", *Electronics,* vol. 51, No. 18, (8/78), pp. 117-121.
Burstell et al., "Preferential Etch . . . -GaAlAs", *IBM Technical Disclosure Bull.,* vol. 20, No. 6, (11/77), p. 2451.

*Primary Examiner*—Jerome W. Massie
*Attorney, Agent, or Firm*—Michael J. Urbano

[57] ABSTRACT

Plasma etching is described as a selective etch for dielectric masks such as SiO$_2$, Si$_3$N$_4$ and certain photoresists in the presence of native oxides of Group III-V compound semiconductors. This process can be used in the fabrication of mesa junction lasers and Burrus light emitting diodes.

14 Claims, 6 Drawing Figures

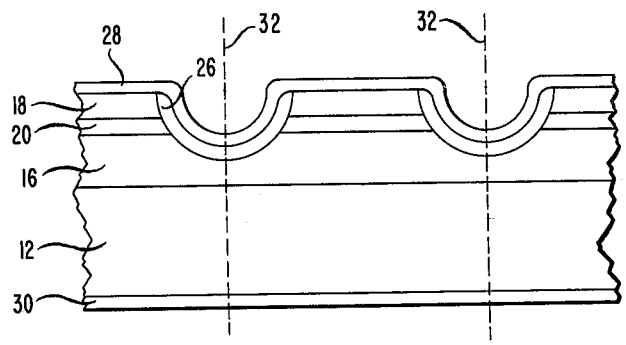
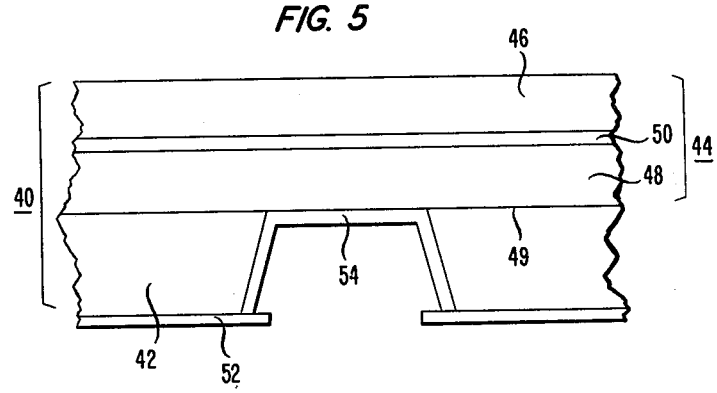
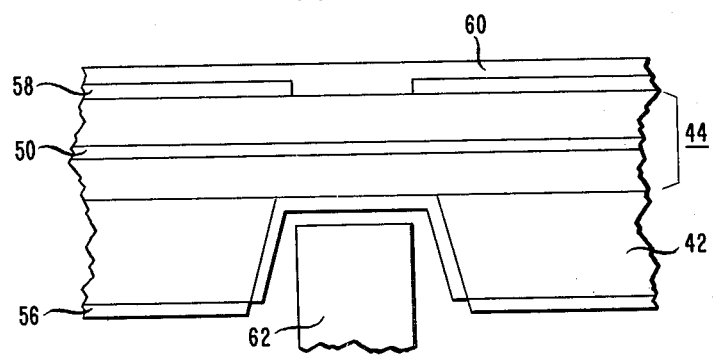

SELECTIVE PLASMA ETCHING OF DIELECTRIC MASKS IN THE PRESENCE OF NATIVE OXIDES OF GROUP III-V COMPOUND SEMICONDUCTORS

CROSS-REFERENCE TO RELATED APPLICATION

This application was concurrently filed with application Ser. No. 007,429 of R. L. Hartman et al (Case 6-3-6-1) entitled "Buried Double Heterostructure Laser Device".

BACKGROUND OF THE INVENTION

This invention relates to a process for delineating patterns of native oxides of Group III-V compound semiconductors.

The usefulness of native oxides in the fabrication of some Group III-V compound (e.g., AlGaAs) semiconductor device structures has in the past been limited by the rapid etching of these oxides during wet chemical procedures (i.e., in the presence of acids and bases). As a consequence, device structures which require a delineated, retained native oxide can be fabricated only if the photoresist or masking material can be removed with organic solvents which do not etch the native oxide. Although these native oxides can be stabilized against chemical attack, this stabilization procedure requires high temperatures (>600 degrees C.) which are above the allowed temperature range for some device structures. Thus, the well-developed, good dielectric masks such as $Si_3N_4$, $SiO_2$, and $Al_2O_3$ cannot be used without exposing the devices to the high temperatures needed to stabilize the native oxides. In addition, many device structures cannot tolerate etching of the host semiconductor during the mask removal process (e.g., a mask over the zinc skin-diffused contacting area of AlGaAs mesa lasers can be removed only with an etch selective to the mask material alone). These problems pose severe limitations on the use of the native oxides of Group III-V compounds as incorporated parts of device structures.

SUMMARY OF THE INVENTION

We have discovered that dielectric masks, such as certain photoresists, $SiO_2$, and $Si_3N_4$, can be selectively etched in the presence of Group III-V compound semiconductors and native oxides thereof by plasma etching in a suitable atmosphere, preferably a halocarbon. The procedure, in accordance with an illustrative embodiment of our invention, includes the steps of: (a) forming a dielectric layer on a body of Group III-V compound semiconductor; (b) patterning the layer to form windows therein which expose the underlying portions of the semiconductor; (c) anodically growing native oxide in the windows on the exposed semiconductor; characterized by (d) plasma etching the dielectric layer in an atmosphere which is effective to remove the dielectric layer but to leave the native oxide layer and semiconductor body intact.

This process can delineate patterns in native oxides of Groups III-V compound semiconductors consistent with their use for protection, passivation, or current confinement as required by device design and function. In particular, Burrus light emitting diodes, mesa junction lasers, and buried double heterostructure junction lasers, where the native oxide is incorporated in the final device structure, require just such a selective etching procedure.

BRIEF DESCRIPTION OF THE DRAWING

Our invention, together with its various features and advantages, can be more readily understood from the following more detailed description taken in conjunction with the accompanying drawing in which the figures are not drawn to scale in the interest of clarity.

FIGS. 1-4 show in cross-section the sequential development of a mesa junction laser; and FIGS. 5 and 6 show in cross-section the fabrication of a Burrus light emitting diode.

DETAILED DESCRIPTION

Plasma Etching in General

Figure 1:
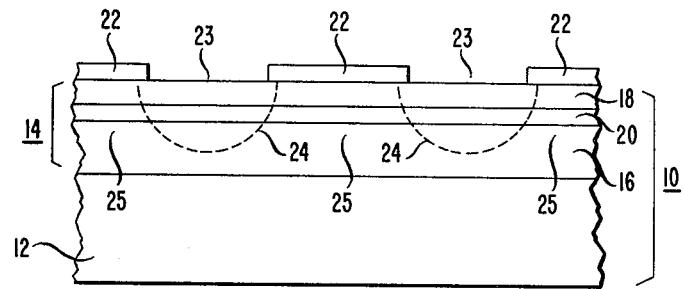

As described by C. J. Mogab in copending application Ser. No. 929,568, filed on July 31, 1978, plasma etching experiments are typically carried out in an 18" diameter, radial flow, parallel plate reactor. The apparatus contains two horizontal, parallel, hollow metal electrodes in a pyrex vacuum enclosure. In operation, rf power at a frequency of about 13.56 megahertz (not critical) is applied to the upper plate to initiate and sustain a discharge. The lower plate held at ground potential serves as the platen for the material to be etched. Discharge is operated in the 0.1 to 1.0 torr range with continuous flow of etchant gases through the discharge region. Effluent is exhausted illustratively by a 25 cu. ft./min. two-stage mechanical forepump. Prior to initial pump out, hot water (~80 degrees C.) is passed through both electrodes for a few minutes to minimize water condensation during loading. The chamber is then opened and material to be etched is placed on the platen. The chamber is then closed and the pump set in operation. When a pressure of about 10 torr is attained, hot water is replaced by flowing cold water (~25 degrees C.). Pumping is continued to a base pressure of a few millitorr and etchant gas flow is commenced. Etch conditions are generally maintained as follows:

Pressure-0.1 to 1.0 torr
Flow rate-20 to 200 SCCM (cm$^3$/min. as standardized at room temperature)
rf power-100 to 2000 watts
Electrode spacing-7 to 30 millimeters
Substrate temperature-25 to 30 degrees C.

EXAMPLE I SELECTIVE ETCHING OF AlGaAs

We have found that plasma etching in an atmosphere of a halocarbon and oxygen is a selective etch for dielectrics such as $SiO_2$, $Si_3N_4$, and photoresist in the presence of anodically grown native oxides of $Al_xGa_{1-x}As$ and the host semiconductors. The selective etching property was demonstrated as follows: $Al_xGa_{1-x}As$ (x=0.36) was epitaxially grown by LPE on an n-type (100) oriented GaAs substrate. A 6700 Angstrom thick layer of $SiO_2$ was plasma deposited on the AlGaAs layer. Using standard photolithographic techniques, the $SiO_2$ layer was patterned to form 125 μm wide stripes separated by 200 μm wide spaces along the <110> direction. Conventional anodic oxidation was then employed to grow a native oxide layer 1800 Angstroms thick in each of the spaces. The sample was then placed in a parallel-plate, radial flow reactor and exposed to a plasma of carbon tetrafluoride ($CF_4$) with 8% oxygen which completely removed the $SiO_2$ stripes. The etching conditions were as follows: 200 W of power, 0.4 torr, 32 mm electrode spacing, 100 degrees C. platen temperature, 200 SCCM flow rate, 0.5 in. wafer diameter, resulting in an etch rate of 330 Angstroms per minute. The etching selectivity was excellent; that is, no significant removal of the native oxide or the host AlGaAs epilayer was observed. These results were confirmed by Talystep measurements.

This same plasma etching procedure has also been used to remove selectively certain photoresists and $Si_3N_4$ dielectric layers. We have also found that the same procedure is effective for selectively etching these dielectric layers in the presence of GaAs and native oxides thereof. Subsequent experiments in the fabrication of mesa double heterostructure GaAs-AlGaAs junction lasers further demonstrated that the selectivity is essentially independent of the conductivity type of the AlGaAs layer as well as the carrier concentration of these layers in the range of $10^{17}$ to mid $10^{18}/cm^3$. Although our experiments confirmed selectivity for $Al_xGa_{1-x}As$ with x in the range of 0 to 36% only, we believe that the procedure is also effective for larger amounts of Al and in general for $0 \leq x \leq 1$.

EXAMPLE II

GaAs, InP, GaSb

We performed similar experiments on wafers of GaAs, InP, and GaSb using a mixture of 60% $C_2F_6$ (Freon 116) and 40% $CHF_3$ (Freon 23) as the plasma etching atmosphere.

More specifically, on each of the above wafers, 3200 Angstroms of $SiO_2$ was simultaneously deposited and then windows were opened in the $SiO_2$ in the usual fashion. Native oxide layers were then formed in the windows using a standard anodization procedure sequentially on the wafers. From SEM photographs, we determined that about 1600 Angstroms (±200 Angstroms) of native oxide formed in the windows on the GaAs wafer. This oxide was substantially uniform in thickness. However, the corresponding oxides on the InP and GaSb were less uniform and had an average thickness of about 1300 Angstroms and 1200 Angstroms, respectively. After those oxides were grown and measured, all three wafers were simultaneously subjected to plasma etching in the above-described halocarbon atmosphere. The plasma etching exposure time was three times longer than necessary to completely remove the $SiO_2$. This overexposure treatment was performed to insure that all the $SiO_2$ would be etched away, thus demonstrating selectivity.

The experimental results confirmed the selective nature of the etching process: in all three cases, the $SiO_2$ was completely removed but the native oxide layer remained: about 1600 Angstroms of native oxide remained in the windows on the GaAs wafer, about 1100 Angstroms on the InP wafer and about 800 Angstroms on the GaSb wafer. With both the GaAs and InP the host semiconductor (under the $SiO_2$ mask) was substantially unperturbed by the etching process. However, in the GaSb case, some unidentified material was present on the host semiconductor where the $SiO_2$ mask had been. SEM photographs indicated that the unidentified material was not $SiO_2$, however. We believe, moreover, the presence of this material most probably resulted from the overexposure to plasma etching and could be eliminated by simply reducing the etching time to that required to remove the $SiO_2$. Further experiments, in which the etching time for GaSb samples was reduced, confirmed our expectations: no residual material remained where the $SiO_2$ had been.

Experience with plasma etching generally suggests that other atmospheres such as $C_2F_6$ alone or $CHF_3$ alone may also be suitable for selective etching as contemplated herein.

Thus, our plasma etching procedure is preferential in Group III-V compound semiconductors in that it selectively attacks $SiO_2$, $Si_3N_4$, or photoresist mask materials leaving intact the native oxides and the host semiconductors.

The application of this technique to the fabrication of mesa junction lasers and Burrus light emitting diodes will now be described.

EXAMPLE III

Mesa Junction Lasers

With reference now to FIG. 1, there is shown a semiconductor body 10 including a GaAs substrate 12 and a double heterostructure 14 epitaxially grown thereon. The heterostructure typically includes a pair of opposite conductivity type, wide bandgap, cladding layers of AlGaAs 16 and 18 and a narrower bandgap AlGaAs active layer 20 sandwiched therebetween. A contact facilitating layer of GaAs (not shown) is typically formed on layer 18. The exposed major surface of layer 18 (or of the contact layer if it is present) is masked with a dielectric material such as $SiO_2$ to form rectangular stripes 22 separated by rectangular openings 23. The top surface is then subjected to a suitable etching procedure, such as combining sequential anodic oxidations with stripping procedures using a 50% HCL or $NH_4OH$ solution, or other various, standardized chemical etching solutions, to form grooves 24 in the heterostructure 14, thereby defining mesa structures 25 under each stripe 22.

Figure 2:
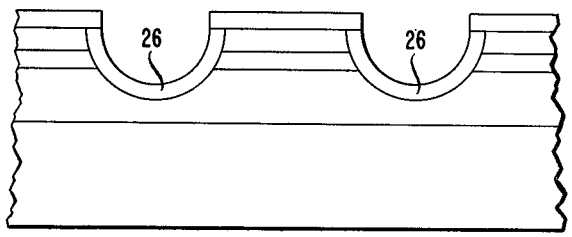
Figure 3:
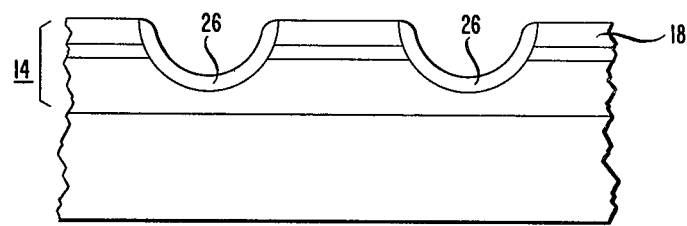

The sample is then placed in an electrolytic bath typically an aqueous solution of phosphoric acid to obtain a pH of about 2.5 as described by B. Schwartz in U.S. Pat. No. 3,798,139 issued on Mar. 19, 1974. As is well known in the art, other solutions and pHs are also suitable. As a result, a native oxide layer 26 is anodically grown in each of the grooves as depicted in FIG. 2. Then, utilizing plasma etching in an atmosphere of a halocarbon and oxygen in accordance with our invention, the dielectric stripes 22 are completely removed, but the native oxide layers 26 and the host semiconductor (e.g., the AlGaAs layer 18) are left intact as shown in FIG. 3. Because the grooves are covered with native oxide, which is an electrical insulator, the top surface can be metallized to form an electrical contact without the need for masking procedures; that is, the contacts are self-aligning. Thus, as shown in FIG. 4, a metal layer 28 is directly deposited, such as by vacuum evaporation, on the top surface so that it directly contacts the exposed portions of layer 18 (i.e., the tops of the mesas) as well as the native oxide layers 26 in the grooves. The substrate contact 30 is then deposited in conventional fashion. In order to separate the sample into separate laser chips, it is typically saw cut along planes 32 and then cleaved along (110) planes perpendicular thereto (i.e., parallel to the plane of the paper).

Laser diodes fabricated in this manner included an n-GaAs (100) substrate 12, an n-$Al_{.36}Ga_{.64}As$ cladding layer 16, a p-GaAs active layer 20 about 0.2 μm thick, a p-$Al_{.36}Ga_{.64}As$ cladding layer 18 and a well-known p-GaAs contact-facilitating layer (not shown) skin diffused with Zn to about $10^{20}/cm^3$. The mesas were typically 3-5 $\mu$m wide at the top thereby producing an active layer 20 typically 6-8 $\mu$m wide. These diodes operated continuous wave at room temperature at current thresholds of approximately 140 mA.

Alternatively, where a lower capacitance laser diode is desired, photolithographic masking techniques or electroplating could be employed so that electrical contact 28 is formed only on the tops of the mesas and not on the native oxide layers 26.

BURRUS LIGHT EMITTING DIODE

In order to fabricate a Burrus light emitting diode, as shown in FIG. 5, one typically starts with a semiconductor body 40 comprising a GaAs substrate 42 and a double heterostructure 44 epitaxially grown thereon. As with the laser structure, the heterostructure 44 includes a pair of opposite conductivity type, wide bandgap, AlGaAs cladding layers 46 and 48 and a narrower bandgap AlGaAs active layer 50 sandwiched therebetween. Illustratively, the active layer 50 contains about 0 to 8% Al and is about 1 to 4 $\mu$m thick. In order to form the Burrus hole in the substrate, the exposed major surface of the substrate 42 is masked with a dielectric layer 52 typically comprising $SiO_2$. An opening is formed in the $SiO_2$ layer 52 using conventional photolithographic techniques and the sample is then exposed to a well-known stop etchant such as $H_2O_2:NH_4OH$ having a pH of 8.5. If the substrate 42 is {100} oriented and the <110> direction is perpendicular to the plane of the paper, this etchant will form a hole in the shape of a truncated pyramid. The etching process essentially stops when the hole penetrates to the interface 49 between AlGaAs layer 48 and GaAs substrate 42. The sample is then transferred to anodic oxidation apparatus as described in the aforementioned Schwartz patent in order to grow a native oxide layer 54 on the sides and the bottom of the hole as shown in FIG. 5. The thickness of this native oxide layer could be adjusted to form an anti-reflecting coating and thereby increase the efficiency of the LED. This native oxide layer also serves as a passivating layer on the normally exposed epitaxial surface of layer 48 at the bottom of the etched hole.

Then, using plasma etching in accordance with our invention, the dielectric layer 52 is selectively removed, but the native oxide layer 54, the exposed portion of layer 48, and the substrate 42 are left intact.

A suitable selective metallization procedure is then employed to form a metal layer 56 on the substrate surrounding the hole therein. The metal layer 56 thus could be formed by appropriate masking and metal evaporation. Preferably, however, metal layer 56 is deposited by electroplating which requires no additional masking; i.e., the native oxide layer 56 inherently acts as a mask and prevents the formation of electroplated metal thereon.

The free major surface of the double heterostructure 44 is then supplied with a suitable electrical contact such as the restricted area dot-shaped contact 60 formed in the aperture of a dielectric mask 58.

When forward biased, the portion of the active layer 50 beneath the dot-shaped contact 60 emits spontaneous radiation which is collected and transmitted by an optical fiber 62 positioned in the bottom of the hole in substrate 42 as shown in FIG. 6.

Alternatively, this type of Burrus double heterostructure could be employed as a photodiode for detection of radiation guided by optical fiber 62 into the active region 50. In either case, it is important that no metal layer be formed in the bottom of the hole which would prevent the transmission of the radiation emitted by active layer 44 or transmitted from fiber 62. Thus, the electroplating procedure for forming metal contact 56 and automatically preventing the deposition of metal in the hole is preferred.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, native oxides can be grown by plasma oxidation (i.e., magnetically confined or anodic) as well as by anodization in liquid solutions of the type described in the aforementioned Schwartz patent.

From a theoretical standpoint, we believe the selectivity aspect of our invention arises from the ability of the halogen, particularly flourine, in the plasma etching atmosphere to combine with silicon in $SiO_2$ and $Si_3N_4$ to form volatile compounds, and its inability to form such volatile compounds with the native oxides of Group III-V compounds. With respect to photoresist, on the other hand, the atmosphere should include oxygen as well as a halogen. The halogen probably abstracts hydrogen from the resist and thus renders the resist susceptible to attack by oxygen. Most photoresists commonly used in semiconductor processing have an organic base and thus include hydrogen. Photoresists, which we have successfully used in selective plasma etching experiments include "LSI" photoresist manufactured by Philip A. Hunt Chemical Corp., Palisades Park, N.J., the positive "AZO" photoresists manufactured by Shipley Company, Inc., Irvine, Calif.

We claim:

1. A method of selectively removing a layer of dielectric material from a surface of a Group III-V compound semiconductor without also removing a layer of native oxide on said surface by subjecting both of said layers simultaneously to plasma etching in an atmosphere effective to remove said dielectric layer without attacking said native oxide or said Group III-V semiconductor.

2. The method of claim 1 wherein the Group III element of said compound is selected from the Group consisting of Ga, Al, In and combinations thereof and said Group V element is selected from the Group consisting of As, P, Sb and combinations thereof.

3. The method of claim 2 wherein said dielectric material is selected from the group consisting of $SiO_2$, $Si_3N_4$ and photoresist.

4. The method of claims 2 or 3 wherein said plasma etching takes place in an atmosphere including a halocarbon.

5. The method of claim 4 wherein said plasma etching takes place in an atmosphere selected from the group consisting of $CF_4$ and oxygen, $C_2F_6$, $CHF_3$, and mixtures of $C_2F_6$ and $CHF_3$.

6. A method of forming a patterned native oxide layer on a surface of a Group III-V compound semiconductor body comprising the steps of: (a) forming on said surface a dielectric layer which can be selectively plasma etched relative to said body and to a native oxide layer to be subsequently formed thereon; (b) patterning said dielectric layer to form windows which expose underlying portions of said surface; (c) forming a native oxide layer on said exposed portions; and (d) subjecting said body and both of said layers simultaneously to plasma etching in an atmosphere effective to remove said dielectric layer without attacking said native oxide or said body.

7. The method of claim 6 wherein said dielectric layer is selected from the group consisting of $SiO_2$, $Si_3N_4$ and photoresist.

8. The method of claims 6 or 7 wherein said forming step (c) comprises anodically growing said native oxide layer on said exposed portions.

9. The method of claims 6 or 7 wherein said atmosphere includes a halocarbon.

10. The method of claim 9 wherein said atmosphere is selected from the group consisting of $CF_4$ and oxygen, $C_2F_6$, $CHF_3$, and mixtures of $C_2F_6$ and $CHF_3$.

11. The method of claims 6 or 7 including between steps (b) and (c) the additional step of forming grooves in said windows in said exposed underlying portions, thereby forming mesas in said body between said grooves, and wherein step (c) includes forming said native oxide layer in said grooves.

12. The method of claim 11 including after step (d) the additional step of depositing a metal layer on the tops of said mesas and on said native oxide layers in said grooves.

13. The method of claim 11 including after step (d) the additional step of selectively forming metal layers on the tops of said mesas but not on said native oxide layers.

14. The method of claim 13 wherein said selective forming step comprises electroplating said metal layer.

* * * * *